United States Patent

[11] 3,585,633

[72] Inventor Robert E. Young
Harris, Tex.

[21] Appl. No. 758,537
[22] Filed Sept. 9, 1968
[45] Patented June 15, 1971
[73] Assignee Dresser Industries, Inc.
Dallas, Tex.

[54] D-A OR A-D CONVERTER
1 Claim, 2 Drawing Figs.

[52] U.S. Cl. .......... 340/347
[51] Int. Cl. .......... H03k 13/02
[50] Field of Search .......... 340/347

[56] References Cited

UNITED STATES PATENTS

| | | | |
|---|---|---|---|
| 3,241,133 | 3/1966 | Herzl .......... | 340/347 |
| 3,460,131 | 8/1969 | Gorbatenko et al. .......... | 340/347 |
| 3,475,749 | 10/1969 | Plice .......... | 340/347 |

*Primary Examiner*—Maynard R. Wilbur
*Assistant Examiner*—Charles D. Miller
*Attorneys*—Robert W. Mayer, Daniel Rubin, Peter J. Murphy, Frank S. Troidl, Roy L. Van Winkle and William E. Johnson, Jr.

ABSTRACT: A reference voltage is applied to the noninverting input of a differential amplifier. The output of the amplifier is connected through a feedback resistor to the inverting input so that the output voltage increases as required to maintain the inverting input at the same potential as the reference voltage. A plurality of resistance branches connect the inverting input to ground. Current through the feedback resistor can be increased incrementally by switching selected resistance branches conductive, thus requiring an increased output voltage in order to maintain the inverting input at the reference voltage. Current through each resistance branch is controlled by a transistor operated in the inverted mode so that the IR drop through the transistor tends to cancel the offset voltage of the transistor. When operated as a digital-to-analog converter, the digital input is used to control the resistance branches and the output of the amplifier produces the analog signal. A step approximation analog-to-digital converter is also described in which the output of the differential amplifier is applied to one input of a comparator and an analog signal applied to one input of a comparator and an analog signal applied to the other input. The resistor branch network is operated by a step approximation logic circuit in a manner to maintain the system balanced. The state of the resistor branch network is representative of the digital output. The reference voltage and analog input voltage may also be reversed.

INVENTOR
ROBERT E. YOUNG
William E. Johnson Jr.
ATTORNEYS

D-A OR A-D CONVERTER

BACKGROUND OF THE INVENTION

This invention relates generally to electronic data systems, and more particularly relates to a circuit which may be used as an interface between a digital data system and an analog data system.

Many data processing systems employ both digital and analog subsystems, thus requiring an interface to convert the data from digital to analog form, or from analog to digital form. Many different converters have been proposed for this purpose. However, these converters have generally been relatively complex and expensive, particularly where precision conversion is required.

SUMMARY OF INVENTION CLAIMED

This invention is concerned with a simplified and improved digital-to-analog converter circuit which can, when combined with other circuitry, also be used as an analog-to-digital converter. Generally, the circuit comprises a differential amplifier having a noninverting input, an inverting input, and an output. A resistor connects the output back to the inverting input. The current through the feedback resistor is incrementally controlled by a circuit connecting the inverting input to ground.

In accordance with a specific aspect of the invention, the circuit connecting the inverting input to ground is comprised of a plurality of parallel resistance branches each comprised of a resistor and a transistor operated in the inverted mode.

When operated as a digital-to-analog converter, a reference voltage is applied to the noninverting input of the amplifier, the digital input is applied to control the resistance branches, and the output of the amplifier is the analog output.

In accordance with another specific aspect of the invention, the reference voltage is provided by a Zener diode.

When operated as an analog-to-digital converter, the output of the differential amplifier is applied to one input of a second differential amplifier, and the resistor network is stepped in a predetermined manner by a logic circuit in accordance with the output of the second differential amplifier. The analog signal is then applied to an input of one of the differential amplifiers and a reference potential applied to the other. The step approximation logic then seeks to maintain the two amplifiers balanced by switching the resistor branches conductive, and the state of the resistance branches is representative of the digital output.

The circuit in accordance with the present invention is very inexpensive in that only one resistor and one transistor is required for each bit value in a binary coded decimal network. Also, the circuit requires only a very simple reference voltage due to the constant high input impedance of the differential amplifier.

BRIEF DESCRIPTION OF THE DRAWINGS

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

DESCRIPTION OF PREFERRED EMBODIMENTS

Figure 1:
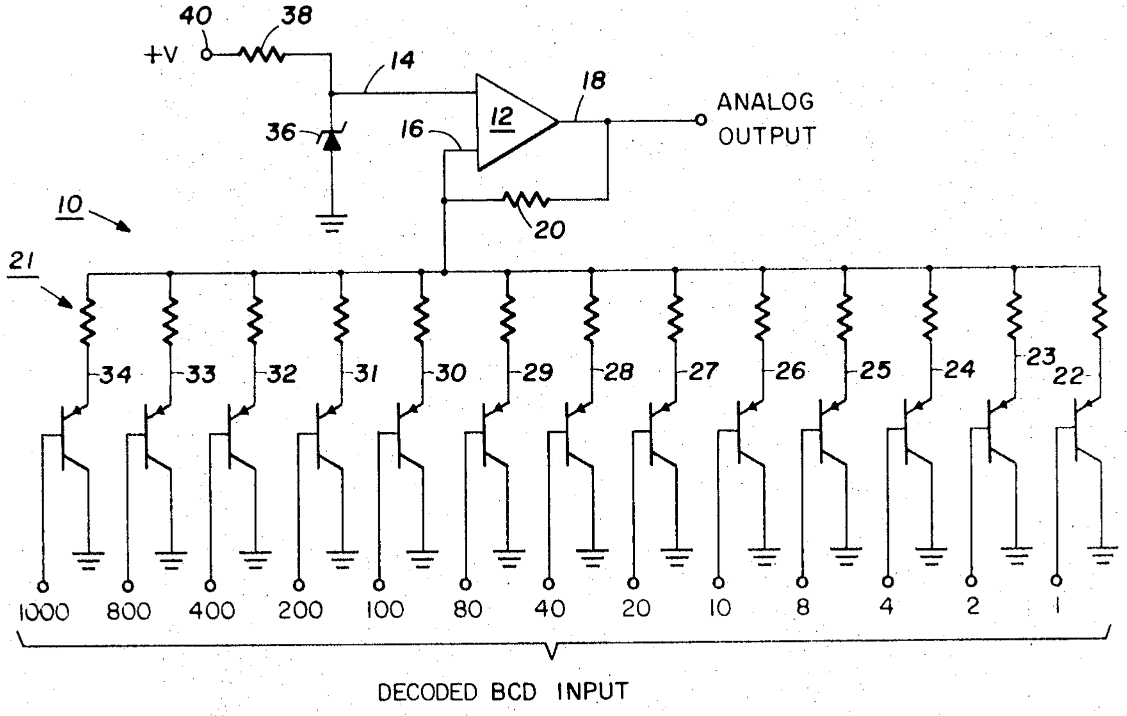
FIG. 1 is a schematic circuit diagram of a digital-to-analog converter in accordance with the present invention.

Referring now to FIG. 1, a digital-to-analog converter in accordance with the present invention is indicated generally by the reference numeral 10. The circuit 10 is comprised of a differential amplifier 12 having a noninverting input 14, an inverting input 16, and an output 18. The output 18 is connected back to the inverting input 16 by a feedback resistor 20.

Current through the feedback resistor 20 can be incrementally increased by a resistor network 21 which is comprised of 13 resistance branches 22—34 connected in parallel between the inverting input 16 and ground. Each of the resistance branches 22—34 is comprised of a resistor and a transistor. The transistor in each of the resistance branches 22—34 is connected in the inverted mode for purposes which will presently be described. The resistors in the branches 22—34 are progressively lower in value so that for a given voltage level at the inverting input 16, the current through the respective branches will be in the ratios 1:2:4:8:10:20:40:8 0:100:200:400:800:1,000 when the branches are turned on. These values are used to designate the decoded binary coded decimal (BCD) inputs which are connected to the bases of the transistors of the respective branches.

A fixed and stable reference voltage is applied to the noninverting input 14 by means of a temperature compensated Zener diode 36 which is connected through a current limiting resistor 38 to a positive voltage supply represented by the terminal 40.

In order to understand the operation of the digital-to-analog converter 10, assume that the voltage drop across Zener diode 36 is 1.0 volt, which is applied to the noninverting input 14. Since the differential amplifier 12 is operated in the negative feedback mode, the output 18 will be at whatever potential is necessary to cause the inverting input 16 to be at the same potential as the noninverting input 14. If the base terminals of all the transistors are more positive than about +1.0 volt, the transistors in all of the resistance branches 22—34 will be nonconductive. Only a very small current will then flow through feedback resistor 20 and the output 18 will be at approximately the same potential as the reference voltage applied to noninverting input 14. If any one of the transistors is saturated by switching the base negative with respect to the collector, the additional current flow through feedback resistor 20 results in an IR drop, thus requiring a higher voltage at the output 18 in order to provide the potential at the inverting input 16 equal to the reference potential applied to the noninverting input 14.

It will be noted that current through each resistance branch is equal to 1R, where R is the resistance of the branch. By selecting the resistors in the ratio previously mentioned and indicated on the drawings, a binary coded decimal input can be decoded by logic circuitry (not illustrated) so as to control the resistance branches 22—34 to divide the range of the analog voltage at the output 18 into 2,000 equal increments. Current through resistance branch 22 might typically be 0.00025 ma., in which case the current through branch 34 would be 0.250 ma. The voltage at output 18 would then typically range from about +1.0 volt to about +5.0 volts if the feedback resistor 20 is 8,000 ohms.

It will be noted that a very simple reference voltage is required for the noninverting input 14 because the input impedance produced when the amplifier 12 is maintained in the balanced condition during operation is high and constant. In addition, by operating the transistors in the resistance branches 22—34 in the inverted mode, the offset voltage produced between the collector and emitter as a result of current flow from the base to the collector is opposite in polarity and substantially equal to the IR drop produced by current flow from the emitter to the collector. This configuration eliminates errors that would otherwise result from the IR drop through the transistor.

Figure 2:
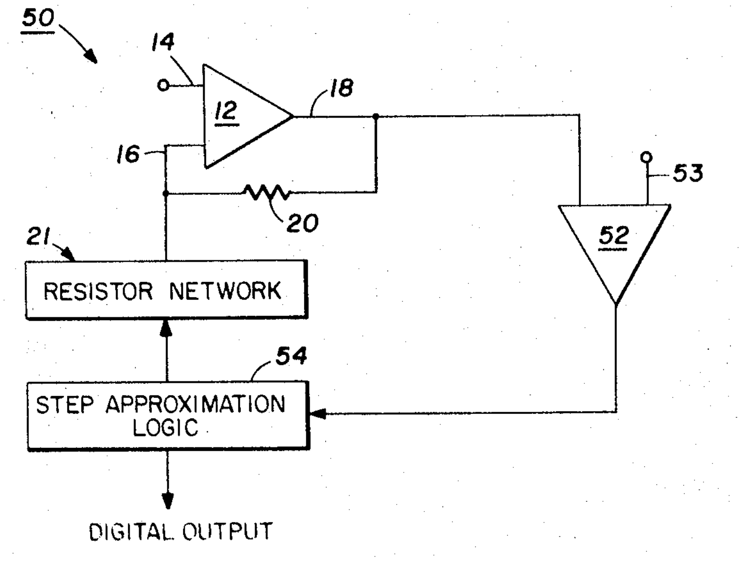
FIG. 2 is a schematic circuit diagram of an analog-to-digital converter in accordance with the present invention.

Referring now to FIG. 2, an analog-to-digital converter is indicated generally by the reference numeral 50. The converter 50 includes all of the components of the D-A converter 10, which are therefore designated by the same reference characters. Thus, the differential amplifier 12 has inputs 14 and 16 and an output 18 which is connected back to the input 16 by the feedback resistor 20. The resistor network 21 incrementally varies current through the feedback resistor 20, and thus varies the voltage at the output 18 as previously described.

The output 18 is connected to one input of a comparator amplifier 52, and the output of the comparator amplifier 52 is connected to a step approximation logic network 54. The comparator amplifier 52 produces one logic level when the output 18 is negative with respect to a voltage applied to the other input 53 and another logic level when the output 18 is positive with respect to the input 53. The step approximation logic 54 controls the resistor network 21 in response to the logic output received from the amplifier 52, and produces a digital output corresponding to the state of resistor network 21. A reference potential is applied either to the input 14 of the differential amplifier 12, or to the input 53 of the comparator amplifiers 52, and the analog input signal is applied to the other of the inputs 14 or 53.

Assume first that the reference potential is applied to input 14, and that the analog input is applied to input 53. If the potential at the output 18 is less than the analog potential applied to input 53, the comparator 52 produces one logic level which is applied to the step approximation logic network 54. The step approximation logic network 54 then switches the resistor network in a predetermined sequence to increase the potential at the output 18 of the amplifier 12 until the potential at the output 18 is in a predetermined relation to the analog voltage applied to input 53. The state of the resistor network 21 necessary to achieve this balance is then the digital output, which may conveniently be provided by the step approximation logic 54. On the other hand, if the analog voltage applied to input 53 is greater than the voltage at output 18, the other logic level is applied to the step approximation logic 54, and the resistor network 21 is stepped in a predetermined sequence until the voltage at the output 18 is again in the predetermined relationship to the analog input voltage. Substantially the same mode of operation is achieved by applying the analog voltage signal to input 14 and a reference voltage signal to input 53.

Although preferred embodiments of the invention have been described in detail, it is to be understood that various changes, substitutions and alterations can be made therein without departing from the spirit and scope of the invention as defined by the appended claims.

What I claim is:

1. In a signal converter, the combination of:

a differential amplifier having a noninverting input, an inverting input, and an output, feedback resistance means connecting the output to the inverting input, means including a plurality of individually controllable branches each comprised of a precision resistor in series with a transistor operated in the inverted mode with the collector grounded for controlling the current through the feedback resistance means in response to a digital value whereby the output of the amplifier will produce an analog value corresponding to the digital value, the noninverting input being connected to a source of reference potential regulated by a zener diode, and further characterized by a comparator amplifier having a pair of inputs and an output, one of the inputs being connected to the output of the differential amplifier and the other being connected to receive the analog input signal, and logic means responsive to the comparator means for switching the means for controlling the current through the feedback resistance to maintain the output of the differential amplifier in a predetermined relationship with respect to the analog input signal.